United States Patent
Chen et al.

(10) Patent No.: US 12,196,687 B2
(45) Date of Patent: Jan. 14, 2025

(54) METHOD FOR INSPECTING PATTERN DEFECTS

(71) Applicant: TAIWAN SEMICONDUCTOR MANUFACTURING CO., LTD., Hsinchu (TW)

(72) Inventors: Ju-Ying Chen, Hsinchu (TW); Che-Yen Lee, Hsinchu (TW); Chia-Fong Chang, Hsinchu (TW); Hua-Tai Lin, Hsinchu (TW); Te-Chih Huang, Hsinchu (TW); Chi-Yuan Sun, New Taipei (TW); Jiann Yuan Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 126 days.

(21) Appl. No.: 17/084,625

(22) Filed: Oct. 29, 2020

(65) Prior Publication Data

US 2021/0270751 A1    Sep. 2, 2021

Related U.S. Application Data

(60) Provisional application No. 62/982,722, filed on Feb. 27, 2020.

(51) Int. Cl.
G01N 21/95        (2006.01)
G01N 21/88        (2006.01)

(52) U.S. Cl.
CPC ..... G01N 21/9501 (2013.01); G01N 21/8806 (2013.01); G01N 21/8851 (2013.01)

(58) Field of Classification Search
CPC ........... G01N 21/8806; G01N 21/8851; G01N 21/9501; G03F 7/7065; H01L 22/12; H01L 22/30
USPC ...................... 356/237.1–237.6, 239.1–239.8
See application file for complete search history.

(56) References Cited

U.S. PATENT DOCUMENTS

| | | | |
|---|---|---|---|
| 5,986,263 A | 11/1999 | Hiroi et al. | |
| 2006/0232769 A1* | 10/2006 | Sugihara | G01N 21/95692 356/237.2 |
| 2007/0055467 A1* | 3/2007 | Tsuji | G01N 21/95607 702/81 |
| 2010/0136717 A1* | 6/2010 | Shin | H01L 22/12 250/306 |
| 2014/0253137 A1* | 9/2014 | Chuang | H01L 22/30 324/750.01 |

\* cited by examiner

*Primary Examiner* — Tri T Ton
(74) *Attorney, Agent, or Firm* — STUDEBAKER & BRACKETT PC

(57) ABSTRACT

In a method for inspecting pattern defects, a plurality of patterns are formed over an underlying layer. The plurality of patterns are electrically isolated from each other. A part of the plurality of patterns are scanned with an electron beam to charge the plurality of patterns. An intensity of secondary electrons emitted from the scanned part of the plurality of patterns is obtained. One or more of the plurality of patterns that show an intensity of the secondary electrons different from others of the plurality of patterns are searched.

20 Claims, 13 Drawing Sheets

METHOD FOR INSPECTING PATTERN DEFECTS

RELATED APPLICATION

This application claims priority to U.S. Provisional Patent Application No. 62/982,722 filed Feb. 27, 2020, the entire contents of which are incorporated herein by reference.

BACKGROUND

Defect inspection is an important aspect of a semiconductor manufacturing operation. As the semiconductor industry has progressed into nanometer technology process nodes in pursuit of higher device density, higher performance, and lower cost, defect inspection has become more difficult. In particular, in nanometer technology process nodes using an extreme ultra violet (EUV) defect inspection tool, the defect capture rate decreases as dimensions shrink. Therefore, defect inspection improvement including film stack, inspection tools, processes, and layout design have been studied to improve the defect capture rate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
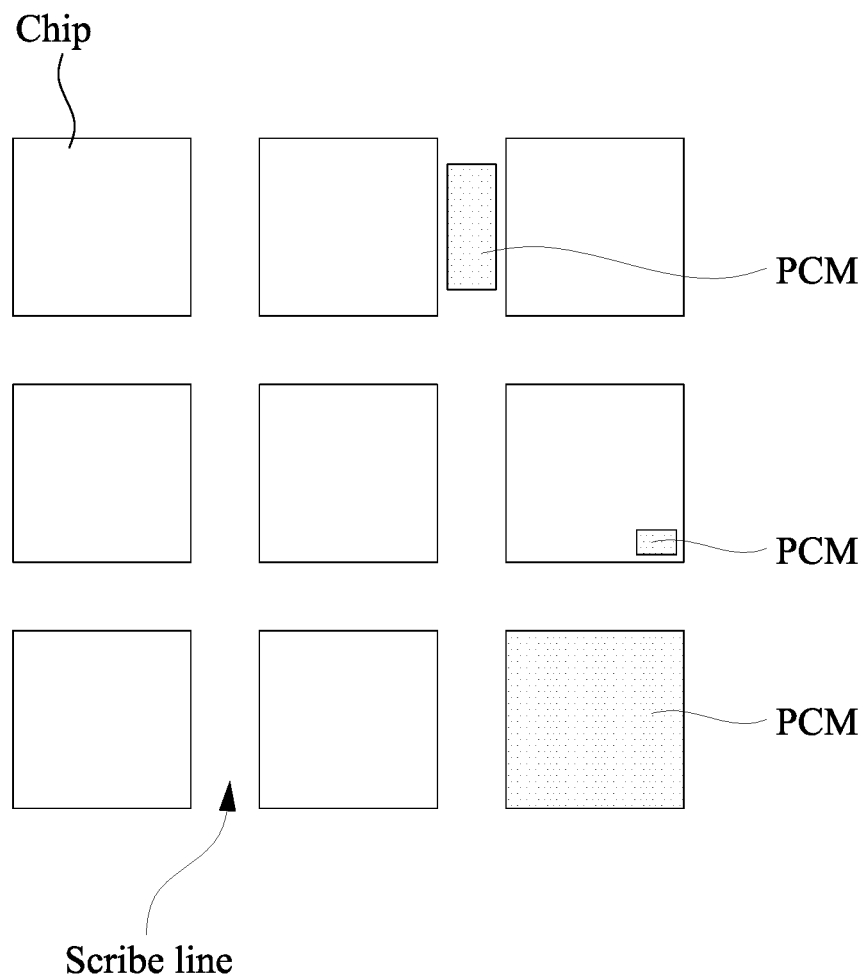
FIG. 1A illustrates process control modules (PCMs) and FIG. 1B shows a layout of a defect inspecting pattern in a PCM in accordance with embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. Materials, configurations, processes, and/or method explained with one embodiment can be applied to other embodiments, and the detailed explanation thereof may be omitted.

The disclosure relates to methods for inspecting pattern defects during a manufacturing operation of semiconductor integrated circuits. In order to improve the yield of semiconductor devices in a semiconductor device fabrication process, it is essential to reduce or to eliminate pattern defects that make one or more semiconductor devices formed over a semiconductor wafer inoperable. Pattern defects are caused by, for example, a film formation process, a lithography operation including a resist coating process, an exposure process and a developing process (as resist pattern defects), an etching operation and a planarization operation including a chemical mechanical polishing (CMP) process.

Pattern defects can be detected by using optical images of patterns utilizing an optical defect inspection tool. In such an optical defect inspection, an optical image of a part of the pattern of one chip area is captured and compared with an optical image of a part of the pattern of another chip area having the same design data. The light source for obtaining optical images (inspection light) can be visible light (about 400-850 nm), ultra violet (UV) (about 280-400 nm) or deep UV (about 150-280 nm). In some embodiments, the wavelength (e.g., peak wavelength) of the inspection light is in a UV or DUV region and is in a range from about 250 nm to about 330 nm. In other embodiments, the wavelength of the inspection light is in a range from about 255 nm to about 320 nm. The captured images are generally processed by image processing to recognize the pattern or distinguish the pattern over the background image.

When the pattern dimensions decrease below about 10-30 nm, although an optical inspection method is generally a high-throughput process, an optical inspection method may be insufficient in resolution and may not be applicable to such a fine pattern. In contrast, an inspection method using an electron beam (or an ion beam) provides a high resolution, but its throughput is 10-10000 times slower than the optical inspection method.

In the present disclosure, a voltage contrast inspection (VCI) using a local electron beam scan is employed. In the VCI, differences in the induced surface voltages (charges) over a scanned region cause differences in secondary electron emission intensities, which in turn causes different image contrast depending on the defects.

Figure 1B:
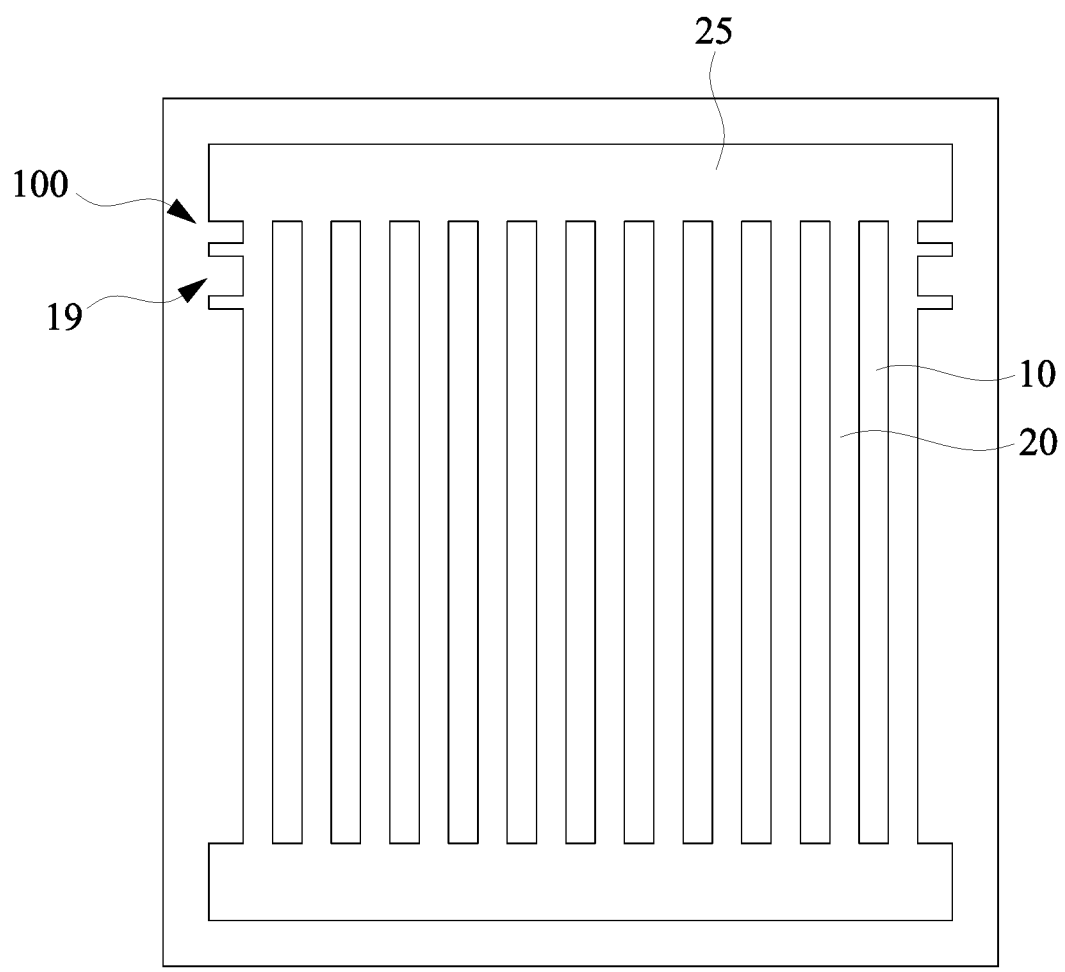

FIG. 1A illustrates process control modules (PCMs) and FIG. 1B shows a layout of a defect inspecting pattern in a PCM in accordance with embodiments of the present disclosure. During a manufacturing operation of a semiconductor device, PCMs are used to monitor process qualities, control processes (e.g., feedback process), and/or detect process problems (defects, etc.). In some embodiments, a PCM is disposed in a scribe lane between chips, within a chip and/or replaces a chip area. In other embodiments, a semiconductor wafer includes only PCMs in a matrix and thus the semiconductor wafer is a test wafer on which no pattern that is or is to be a part of an electronic device, such as a transistor, is formed.

Figure 1C:
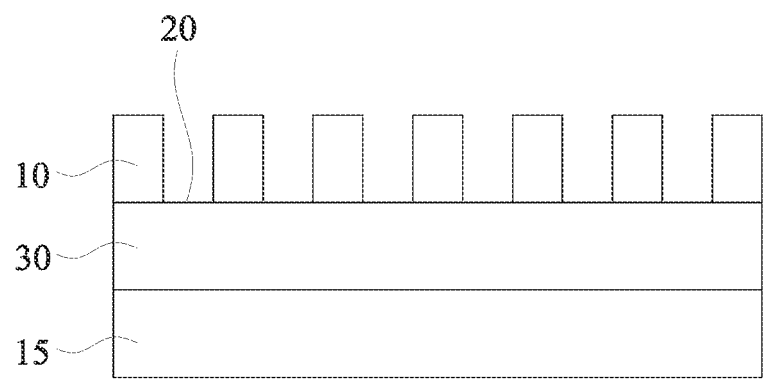
FIGS. 1C and 1D show cross sectional views of the defect inspecting pattern in accordance with embodiments of the present disclosure.
Figure 1D:
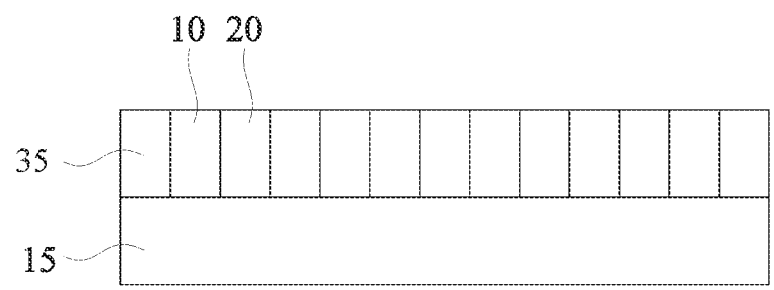

In some embodiments, a PCM includes a defect inspecting pattern 100 as shown in FIG. 1B. In some embodiments, the defect inspection pattern includes a plurality of line patterns 10 arranged with spaces 20 therebetween (line-and-space patterns). In some embodiments, the plurality of line patterns 10 correspond to a pattern to be inspected, and are a convex patterns formed over an underlying layer 30, as shown in FIG. 1C. In other embodiments, the plurality of line patterns 10 are embedded in an insulating layer 35 as shown in FIG. 1D. Although the figures show a straight line with a constant width, the line patterns can include any of a line varying a width, a wavy line or a zigzag line.

In some embodiments, the plurality of line patterns 10 are made of a conductive material, such as etched patterns of a conductive material (e.g., a metallic material or a semiconductor material) or embedded patterns of the conductive material. In some embodiments, the space patterns are formed of exposed portions of an underlying layer. As shown in FIGS. 1B-1D, the plurality of line patterns 10 are electrically isolated from each other by the space patterns 20. In this disclosure, the phrase "the plurality of line patterns are electrically isolated from each other" means that the plurality of line patterns are designed to be electrically isolated from each other (e.g., on a photo mask) when no defect, in particular, no bridge defect exist. In some embodiments, the space patterns 20 are connected to each other by bus-bar patterns 25 at the top and the bottom, as shown in FIG. 1B. In some embodiments, none of the plurality of line patterns 10 is connected to a lower conductive layer disposed below the plurality of line patterns 10, an upper conductive layer disposed over the plurality of line patterns 10 and a conductive pattern disposed at the same level as the plurality of line patterns 10. In other words, each of the plurality of line patterns 10 is electrically floating (e.g., not electrically connected to the ground).

In some embodiments, the plurality of line patterns 10 are formed over or embedded in an underlying layer 30 disposed over a substrate 15 (e.g., a semiconductor wafer). The underlying layer 30 includes one or more dielectric layers, such as a silicon oxide ($SiO_2$) layer, a silicon oxynitride (SiON) layer, a silicon nitride (SiN) layer, a silicon carbide (SiC) layer, a silicon oxy-carbide (SiOC) layer, a silicon oxy-carbo-nitride (SiOCN) layer, an aluminum oxide layer (AlO), a high-k (dielectric constant) material (e.g., hafnium oxide, zirconium oxide) or a low-k (dielectric constant) layer. One or more additional layers, such as a dielectric layer, are disposed between the substrate 15 and the underlying layer 30 in some embodiments. The material of the underlying layer 30 is different from the material of the one or more additional layers in some embodiments. In some embodiments, the thickness of the underlying insulating layer 30 is in a range from about 20 nm to about 100 nm. In some embodiments, the materials for the line patterns 10 and the underlying layer 30 are selected such that the electric conductivity of the material for the line patterns 10 is higher than the electric conductivity of the underlying layer 30. In some embodiments, the electric conductivity of the material for the line patterns 10 is 100 times to 10000 time the electric conductivity of the underlying layer 30.

The substrate 15 may be made of a suitable elemental semiconductor, such as silicon, diamond or germanium; a suitable alloy or compound semiconductor, such as Group Iv-Iv compound semiconductors (e.g., silicon germanium (SiGe), silicon carbide (SiC), silicon germanium carbide (SiGeC), GeSn, SiSn, SiGeSn), Group III-v compound semiconductors (e.g., gallium arsenide, indium gallium arsenide (InGaAs), indium arsenide, indium phosphide, indium antimonide, gallium arsenic phosphide, or gallium indium phosphide), or the like. In some embodiments, the substrate 15 is a glass or quartz substrate for a photo mask or a flat panel display.

In some embodiments, the substrate 15 (e.g., Si wafer) is a monitor or a test wafer, which will not be used to manufacture a semiconductor device as a final product. In other embodiments, the substrate 15 is a product wafer, on which various semiconductor manufacturing operations have been or will be performed to manufacture a semiconductor device including transistors, as a final product.

In some embodiments, the underlying layer 30 and/or the substrate 15 include underlying patterns, and in other embodiments, the underlying layer 30 and/or the substrate 15 has no patterns (a flat surface). The underlying patterns on the underlying layer and/or the substrate may be one of device patterns or may be a monitor pattern specifically prepared for a defect inspection. The underlying patterns can be formed by one or more lithography and etching operations.

In some embodiments, the plurality of line patterns 10 includes one or more conductive layers, such as a semiconductor layers including a crystalline semiconductor layer, a polysilicon layer and an amorphous silicon layer, a metallic layer including one or more selected from the group consisting of W, Cu, Ti, Ag, Al, Ti, Ta, Co, Ni, Ru, Pt, Al, Mn, Co, Pd, Ni, Re, Jr, Ru, Pt and Zr, or an alloy or compound thereof, such as TiN, TaN, $TiO_2$, TiAl, TiAlC, TaAl, TaAlC, silicide, or any conductive material used in a semiconductor device manufacturing operation.

In some embodiments, one or more conductive material layers for the plurality of line patterns 10 are formed by a physical vapor deposition (PVD) method including sputtering, a chemical vapor deposition (CVD) method, an atomic layer deposition (ALD) method, a plating method or any other suitable film formation method. In some embodiments, the thickness of the conductive material layer is in a range from about 20 nm to about 100 nm.

A photo resist pattern is formed over the conductive material layer, by one or more lithography operation. The lithography operation includes a resist coating process, an exposure process, and a developing process. In some embodiments, the exposure process of the lithography operation includes UV lithography, deep UV (DUV) lithography, extreme UV (EUV) lithography, or electron beam lithography, or any other suitable operation. By using the resist pattern as an etching mask, the conductive material layer is patterned into a plurality of line patterns 10. In other embodiments, one or more hard mask layers are formed on the conductive material layer and the hard mask layer is patterned by using the resist pattern as an etching mask, and then the conductive material layer is patterned by using the patterned hard mask layer as an etching mask. In some embodiments, the hard mask pattern is removed and in other embodiments, the hard mask pattern remains over the plurality of lines patterns made of the conductive material.

Figure 2:
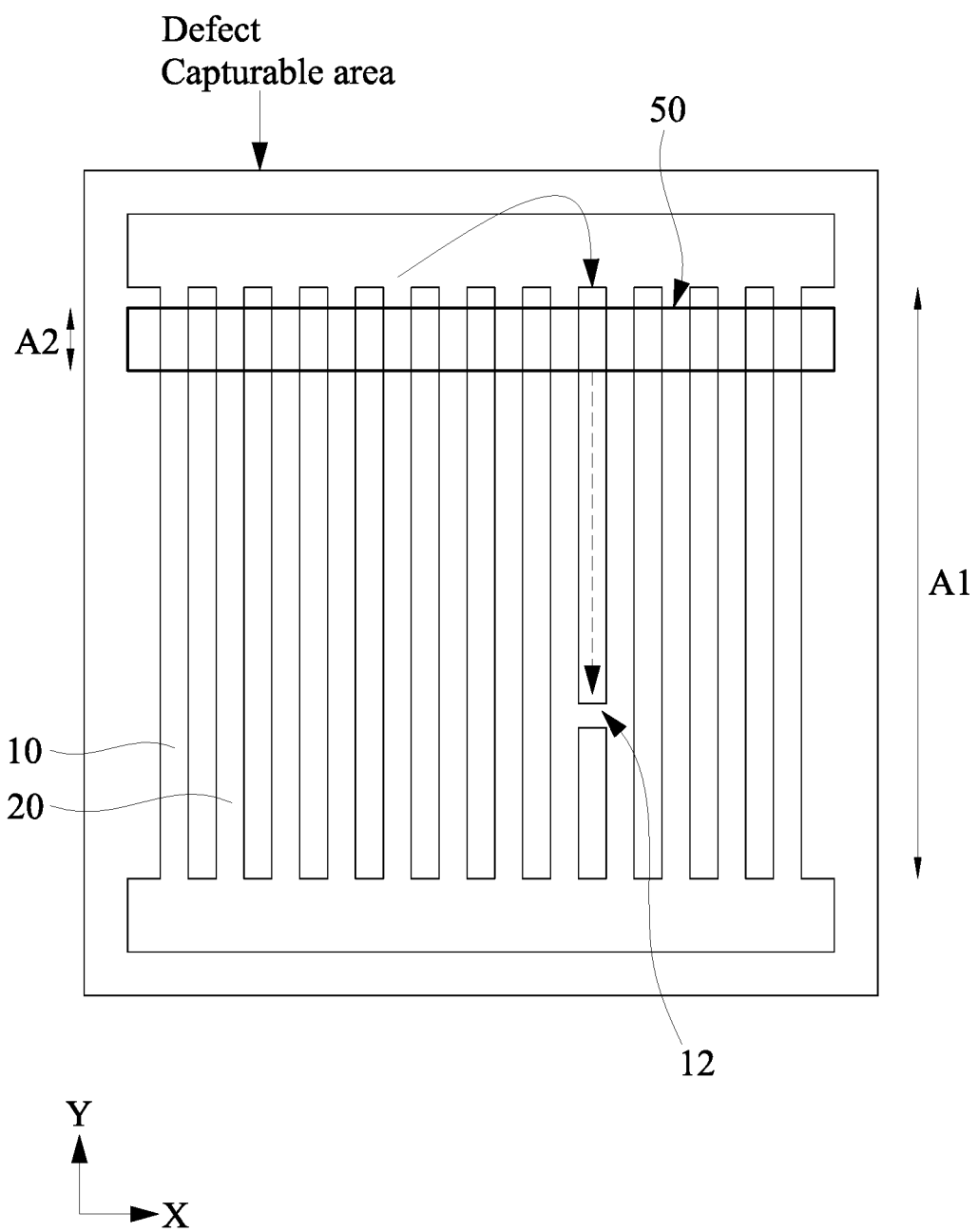
FIG. 2 shows an operation to detect defects using an electron beam in accordance with embodiments of the present disclosure.
Figures 3A, 3B:
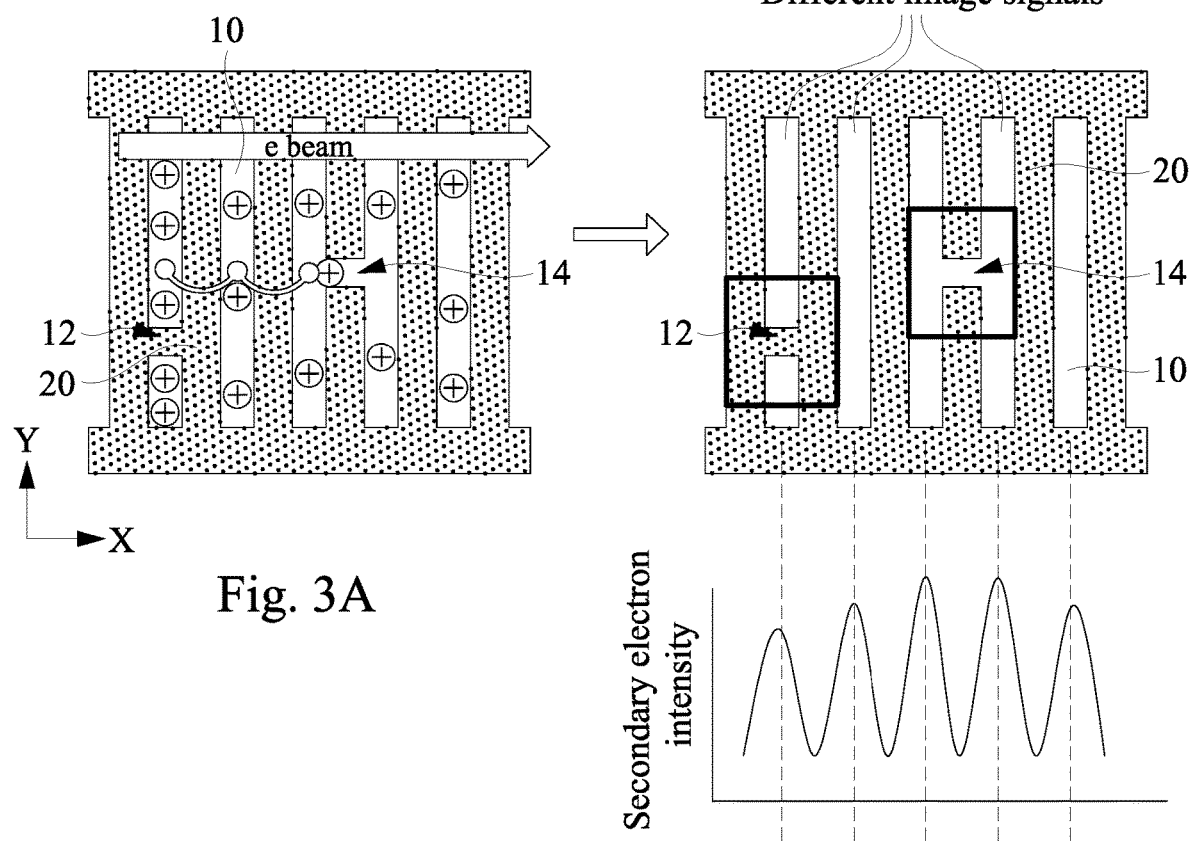
FIGS. 3A and 3B show an operation to detect defects using an electron beam in accordance with embodiments of the present disclosure.

FIG. 2 and FIGS. 3A and 3B show an operation to detect defects using an electron beam in accordance with embodiments of the present disclosure. In some embodiments, the plurality of line patterns are referred to as a defect inspection pattern as a group or a set of patterns. In some embodiments, the number of the plurality of line patterns in one group is in a range from 2 to 100, and is in a range from 10 to 50 in other embodiments, depending on the design rule and/or process conditions for a semiconductor manufacturing operation and/or a resolution of an inspection tool.

In some embodiments, the defect inspection is performed by an electron beam inspection apparatus. In some embodiments, an electron beam scans only a selected part of the defect inspection pattern as shown in FIG. 2. In some embodiments, when the entire length of the line patterns is A1, the scanned width A2 is smaller than A1. In some embodiments, A2 is at least about 1%, about 2%, about 5% or about 10% of A1, and at most about 5%, about 10% about 20% or about 50% of A1. In other embodiments, the scanning is a one time operation and thus the scanned width A2 is the same size as the electron beam spot. In some embodiments, alignment marks 19 indicating the scanned width A2 are provided as shown in FIG. 1B.

In some embodiments, the scanned area 50 is located adjacent to the bus-bar pattern 25. In some embodiments, the scanned area 50 is spaced apart from the bus-bar pattern 25 and thus scanned area 50 does not include edges of the plurality of line patterns 10. In other embodiments, the scanned area partially overlaps the bus-bar area 25, and thus the scanned area 50 includes edges of the plurality of line patterns 10.

As shown in FIG. 3A, when a defect 12 or 14 exists in the defect inspection pattern, a charged state of the line patterns changes. For example, when the plurality of line patterns 10 includes a broken defect 12 (a broken line pattern cut into two portions), the broken line pattern is charged with more electrons than a normal line pattern (no cut), which creates a low secondary electron emission intensity. On the other hand, when the plurality of line patterns 10 includes a bridge defect 14 (caused by, for example, resist scum) between two adjacent line patterns, the connected line patterns are charged with less electrons than the normal line pattern, which creates a high secondary electron emission intensity. Thus, when a defect exists, a scanning electron microscope (SEM) image of the electron beam inspection tool has a different contrast (secondary electron signal intensity) than the remaining line patterns of the plurality of line patterns 10 as shown in FIG. 3B. FIG. 3B also shows an intensity of the secondary electrons. In some embodiments, the secondary electron signal intensity of each line pattern is compared with the average intensity of the plurality of line patterns. Thus, it is possible to find a line pattern (or two line patterns) that includes a defect. In some embodiments, when the secondary electron signal intensity or contrast of a line pattern is lower or higher than a threshold value, it is determined that a defect exist in the line pattern (or two line patterns). In some embodiments, the threshold value is ±5%, ±10%, ±15%, ±20% or 30% of the average intensity of the secondary electrons from the plurality of line patterns, or any value therebetween.

In some embodiments, an observation of the defect is performed. When a line pattern having a different contrast (secondary electron signal intensity) is found in the scanned area 50, the field of view of the SEM image is moved along the identified line pattern (e.g., downward as shown in FIG. 2) to find the defects. In some embodiments, the observation is performed from the scanned area 50. In some embodiments, the observation is automatically performed by using an image analysis technique.

In some embodiments, the location of the line pattern having the defect is obtained and stored in a memory for a closer inspection or observation. In some embodiments, the observation is performed by another observation tool, such as an SEM tool. The location is a coordinate of the line pattern or a number of the line pattern counted from one end (left or right in FIG. 2).

In some embodiments, the scanning by an electron beam to the scan area A2 is single scan. In other embodiments, the scanning by an electron beam to the scan area A2 includes multiple scans. In some embodiments, the multiple scanning is performed at the same location, and in other embodiments, the multiple scanning is performed by changing the location along the Y direction within the scan area A2.

Figure 4A:
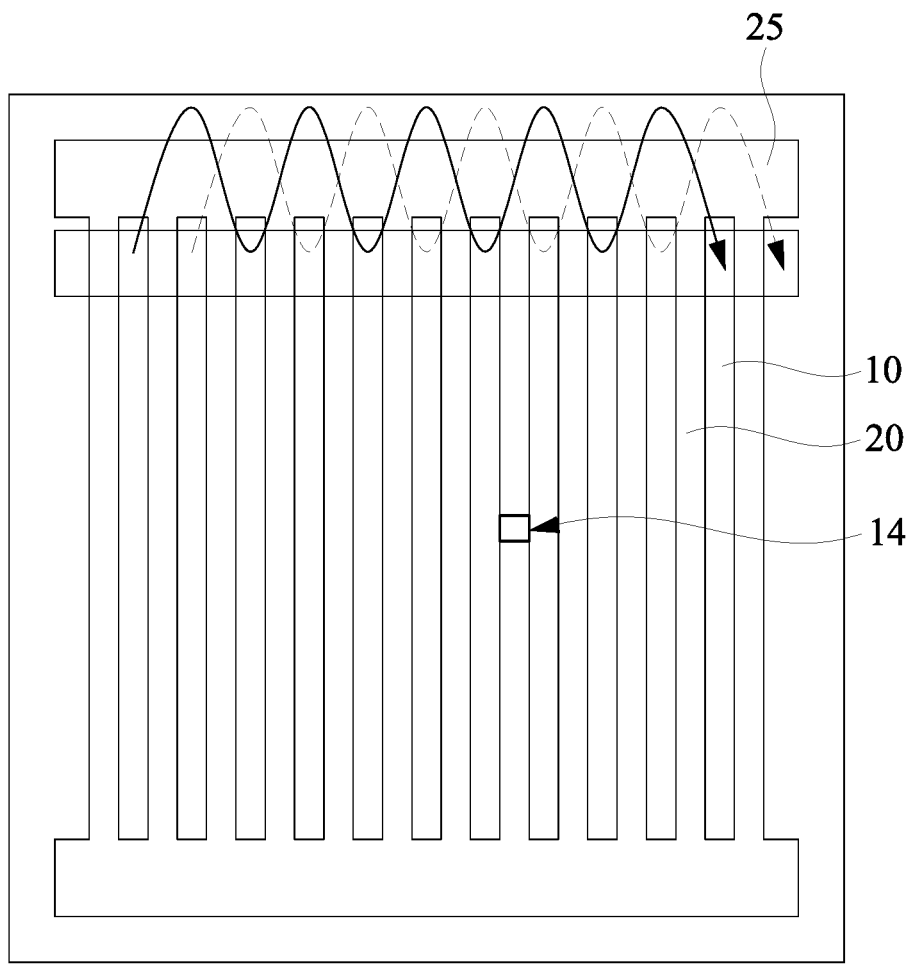
FIGS. 4A and 4B show an operation to detect defects using an electron beam in accordance with embodiments of the present disclosure.

When a single or a multiple scanning is performed to obtain accumulated secondary electrons for a local image, a pattern contrast of two line patterns having a bridge (or scum) defect 14 may not have a sufficient contrast difference than a normal line pattern having no defect. In such a case, the scanning by the electron beam is performed in a skipped manner as shown in FIG. 4A. In some embodiments, the first scanning is performed on the first, third, . . . , and (2n−1)-th line patters and the second scanning is performed on the second, fourth, . . . , and 2n-th line patterns (n=1, 2, . . . ). The second scanning is performed along the same direction or in an opposite direction in some embodiments.

In some embodiments, after the first scanning, the intensities of the secondary electrons (contrast) of the line patterns are obtained (and stored if necessary) and compared with each other to find a line or lines having different intensity. In other embodiments, after the first scanning and the second scanning, the intensities of the secondary electrons (contrast) of the lines patterns are obtained and compared with each other to find a line or lines having different intensity. In some embodiments, the second (or first) scanning is not necessary to find only a bridge defect, but the second (or first) scanning finds a cut (broken) defect in the 2n-th line patterns.

Figure 4B:
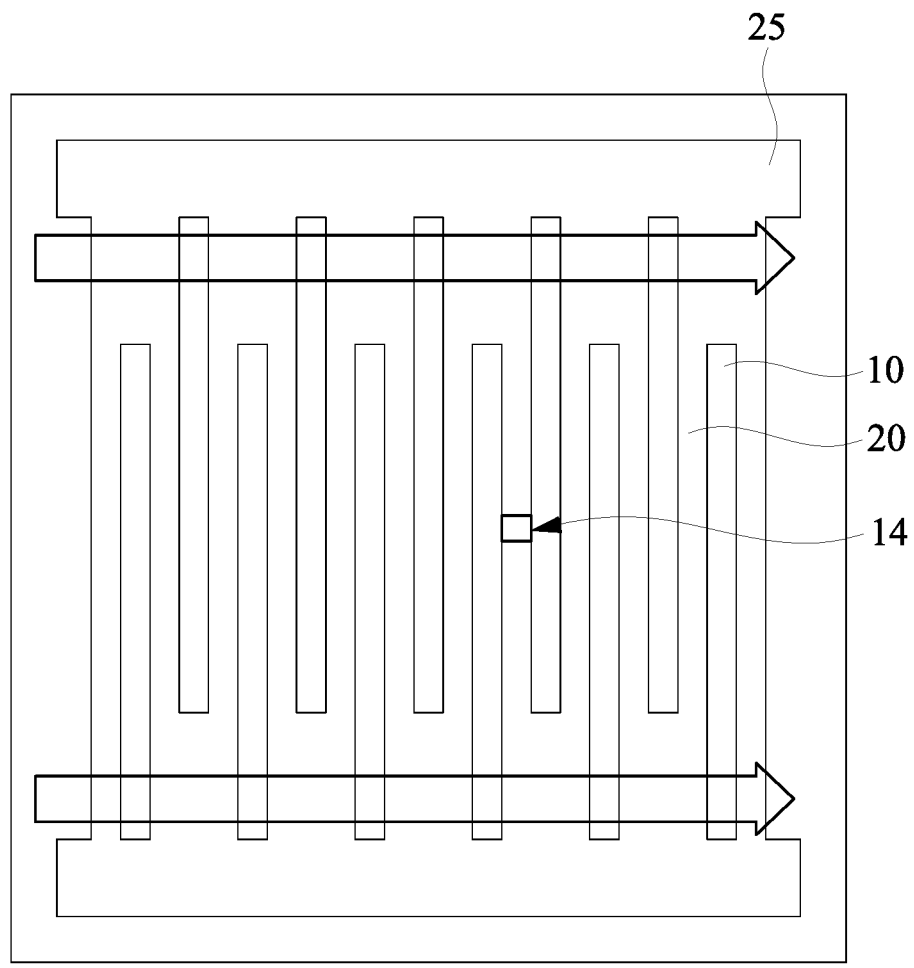

In other embodiments, as shown in FIG. 4B, the plurality of line patterns includes a first group (the first, third, . . . , and (2n−1)-th line patterns) and a second group (the second, fourth, . . . , and 2n-th line patterns) arranged with a shift along the Y direction. The shift amount is adjusted so that the scanning area of the first group does not overlap any line patterns of the second group.

In some embodiments, the scanning for each of the first group and the second group is performed one or more times. In some embodiments, after the scanning for the first group, the intensities of the secondary electrons (contrast) of the line patterns in the first group are obtained (and stored if necessary) and compared with each other to find a line or lines having different intensity. In other embodiments, after the scanning of the first group and the scanning of the second group, the intensities of the secondary electrons (contrast) of the line patterns in the first and second groups are obtained and compared with each other to find a line or lines having different intensity. In some embodiments, the scanning of one of the first and second groups is not necessary to find only a bridge defect, but the scanning of both groups can find a cut (broken) defect in any of the line patterns.

Figure 5A:
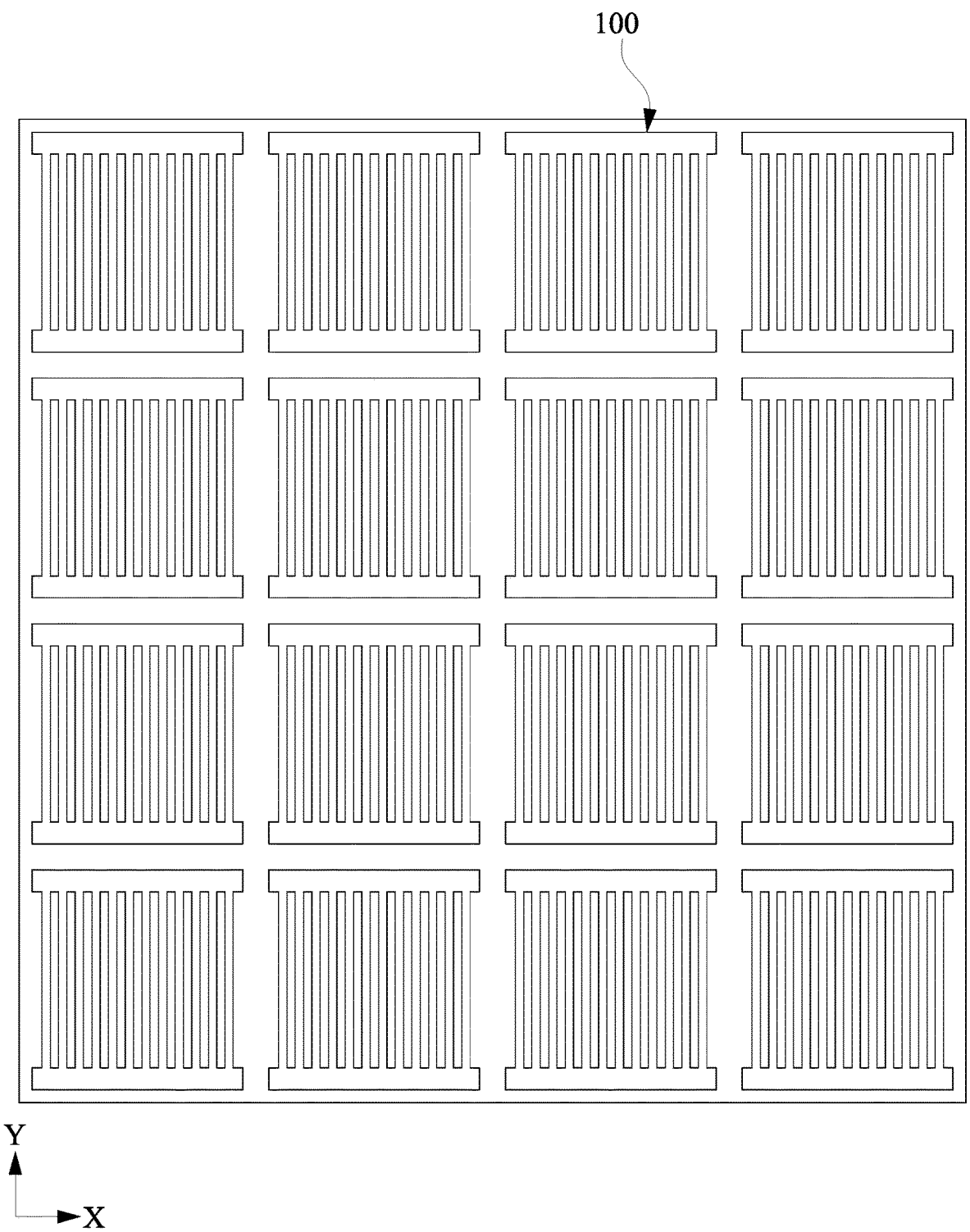
FIGS. 5A and 5B show defect inspecting patterns for an electron beam defect inspection in accordance with embodiments of the present disclosure.
Figure 5B:
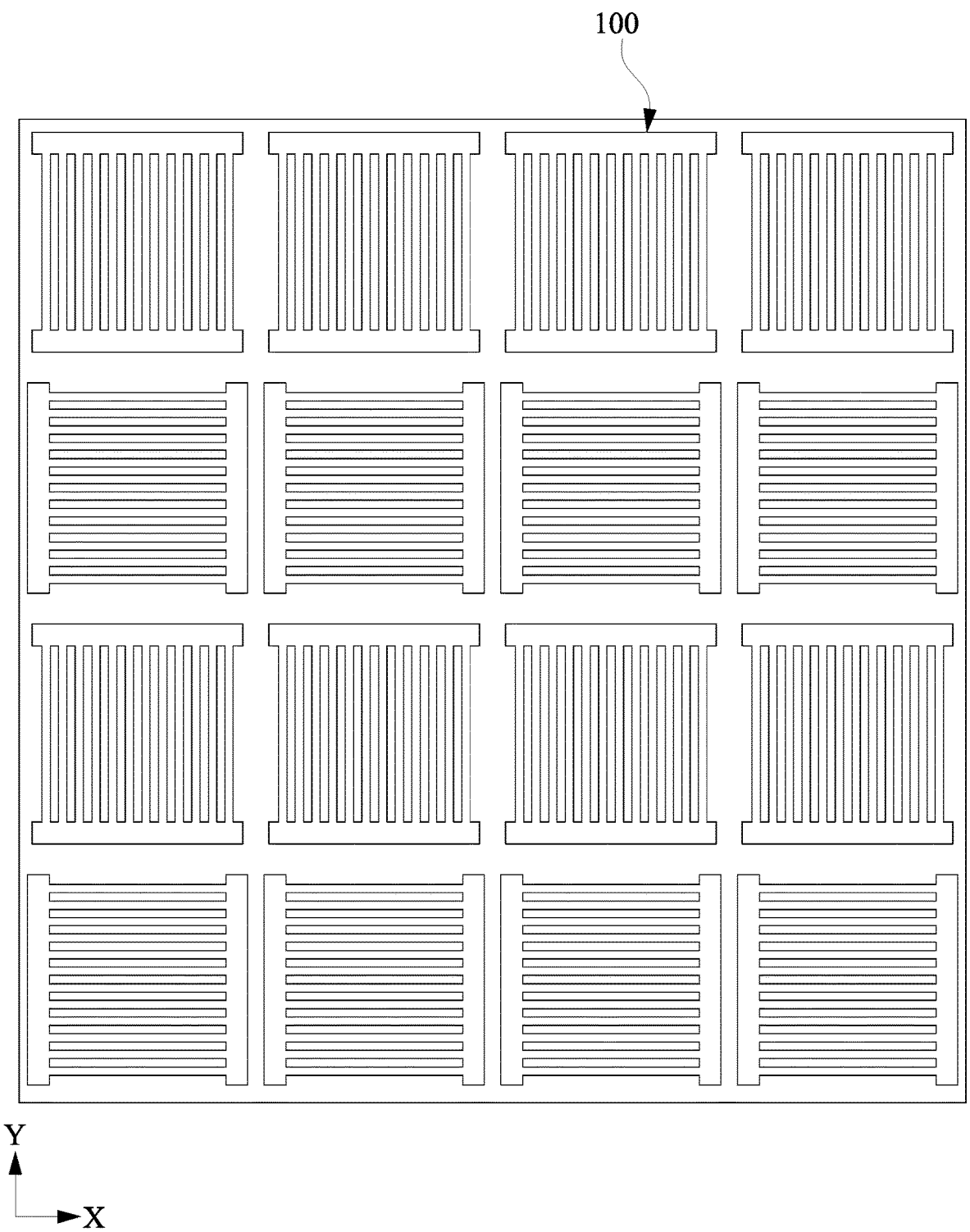

FIGS. 5A and 5B show defect inspecting patterns for an electron beam defect inspection in accordance with embodiments of the present disclosure.

In some embodiments, as shown in FIG. 5A, multiple defect inspection patterns 100 are arranged in matrix in one PCM area. By arranging multiple defect inspection patterns 100, it is possible to more easily find and observe a defect compared with a case where one large defect inspection pattern is placed in one PCM.

In some embodiments, as shown in FIG. 5B, some of the defect inspection patterns 100 have a different orientation than others. In other words, the extending directions of the plurality of line patterns in the defect inspection pattern are different among the defect inspection patterns. In some embodiments, some of the defect inspection patterns 100 are arranged with a 90 degree rotation to the other defect inspection patterns 100. In some embodiments, the rotation is 45 degrees or any other suitable angle.

Figure 6A:
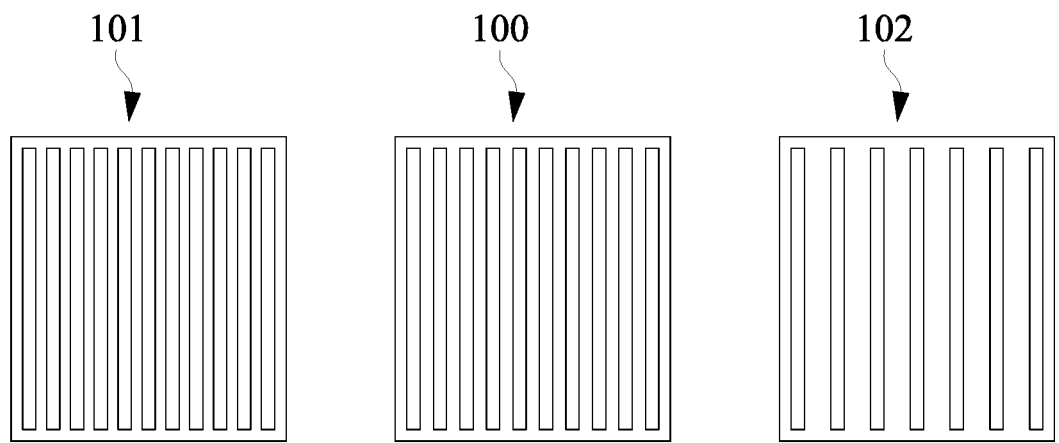
FIGS. 6A and 6B show defect inspecting patterns for an electron beam defect inspection in accordance with embodiments of the present disclosure.
Figure 6B:
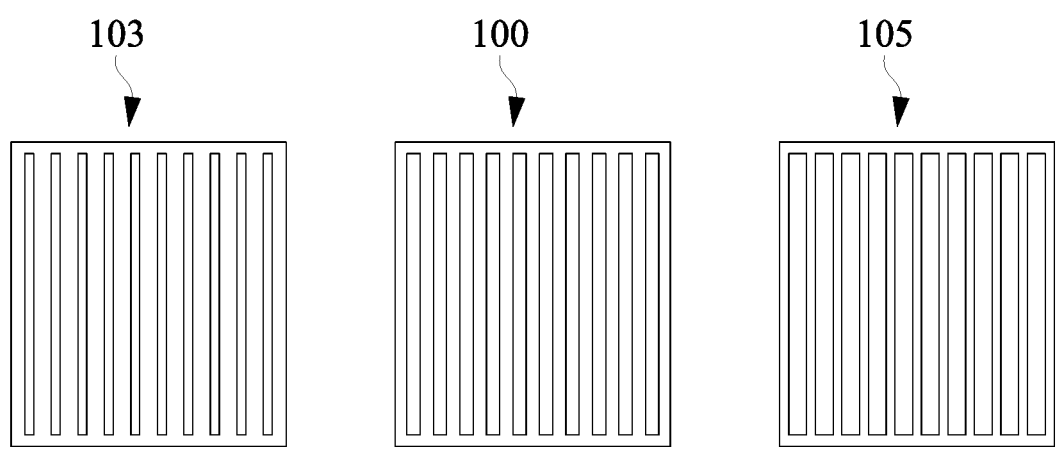

FIGS. 6A and 6B show defect inspecting patterns for an electron beam defect inspection in accordance with embodiments of the present disclosure.

In some embodiments, the PCM includes multiple defect inspection patterns 100 having different dimensions. In some embodiments, as shown in FIG. 6A, pitches of the plurality of line patterns 10 are different among the multiple defect inspection patterns 100, 101 and 102. In some embodiments, the pattern pitch in the defect inspection pattern 101 is smaller than the pattern pitch in the defect inspection pattern 100, and in other embodiments, the pattern pitch in the defect inspection pattern 102 is greater than the pattern pitch in the defect inspection pattern 100, as shown in FIG. 6A. In some embodiments, as shown in FIG. 6B, line widths of the plurality of line patterns 10 are different among the multiple defect inspection patterns 100, 103 and 105. In some embodiments, the line width in the defect inspection pattern 103 is smaller than the line width in the defect inspection pattern 100, and in other embodiments, the line width in the defect inspection pattern 102 is greater than the line width in the defect inspection pattern 105, as shown in FIG. 6B. In some embodiments, the pitches of the plurality of line patterns in the defect inspection patterns 100, 103 and 105 are the same, and in other embodiments, the pitches are different, similar to FIG. 6A. By employing various dimensions in the defect inspection patterns, it is possible to estimate the size of the defects.

Figure 7:
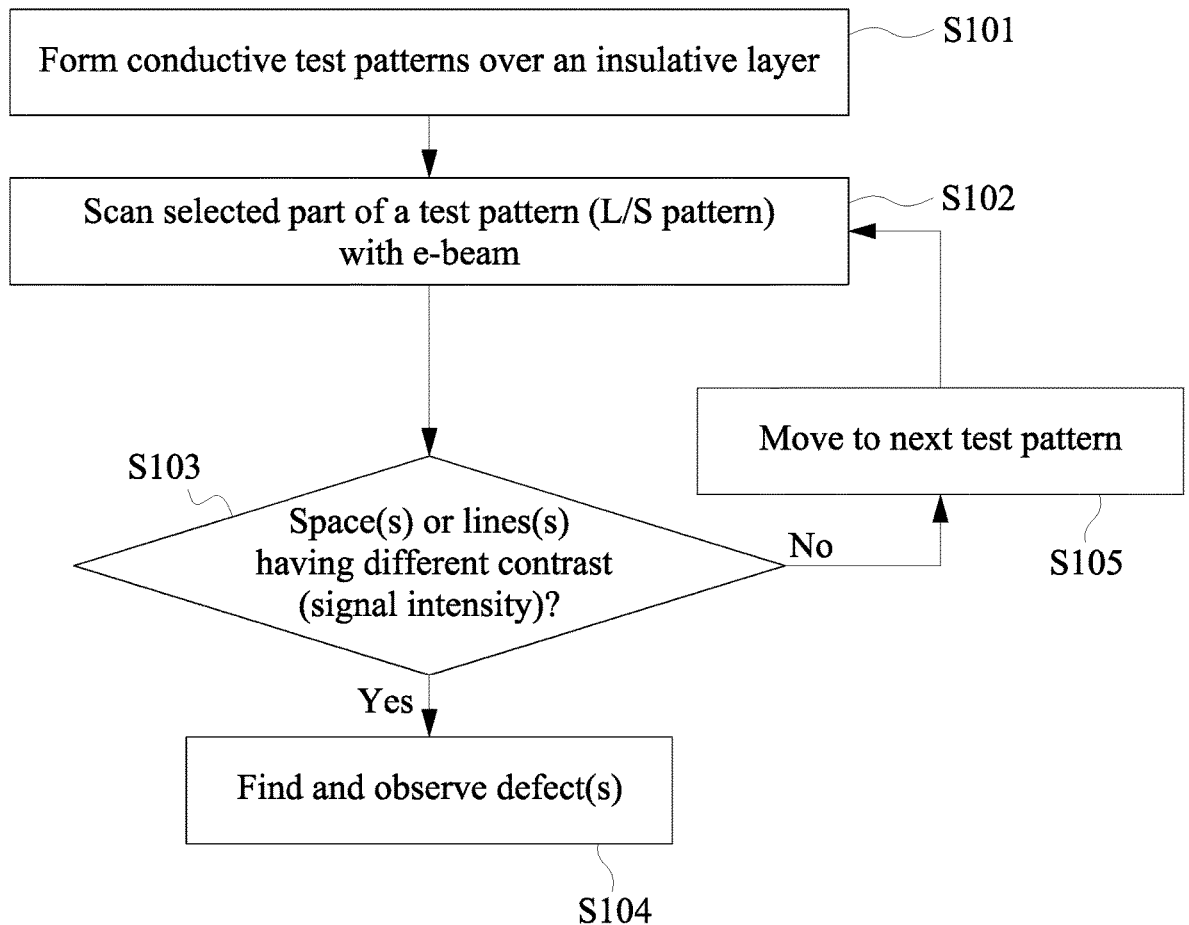
FIG. 7 is a flow chart illustrating a defect inspection in accordance with embodiments of the present disclosure.

FIG. 7 is a flow chart illustrating a defect inspection operation in accordance with embodiments of the present disclosure. In some embodiments, at S101, one or more defect inspection patterns 100 each including a plurality of conductive line patterns 10 are formed over an insulating layer 30 as shown in, for example, FIG. 1C. In some embodiments, the insulating layer 30 is disposed over a semiconductor wafer or a substrate 15. In some embodiments, a defect inspection pattern 100 is formed on an insulating substrate, such as a glass or a quartz substrate used for a photo mask or a flat panel display. In other embodiments, the plurality of conductive line patterns 10 are embedded patterns in an insulating layer 35 formed by, for example, a CMP process, as shown in, for example, FIG. 1D. In some embodiments, the wafer or substrate 15 is a test or monitor wafer not for manufacturing an electronic device as a final product. In other embodiments, the defect inspection pattern 100 is formed on a PCM area over a wafer or a substrate for manufacturing an electronic device as a final product. In some embodiments, after the patterning operation, a cleaning operation is performed to remove insulating material from the plurality of conductive line patterns.

In S102, the wafer or substrate 15 with the one or more defect inspection patterns 100 is loaded in an electron beam inspection tool. Then, each of the defect inspection patterns 100 are partially or locally scanned with an electron beam as set forth above.

In S103, the inspection tool searches for one or more line patterns having different secondary electron signal than other line patterns. When one or more line patterns are found to have a different secondary electron signal, the found line pattern(s) are searched to locate and observe the defected at S104. In some embodiments, the searching and observation of the defect is fully automatically performed by the inspection tool or another observation tool, and in other embodiments, a part of the searching and observing the defect is manually performed by an operator. When no line pattern is found to have a different secondary electron signal at S103, the inspection tool moves to the next defect inspection pattern at S105, and scans the next defect inspection pattern. In some embodiments, the inspection tool scans multiple defect line patterns sequentially and obtains (and stores in a memory) defect information, and then the observation process is performed by the inspection tool or another observation tool.

Figure 8:
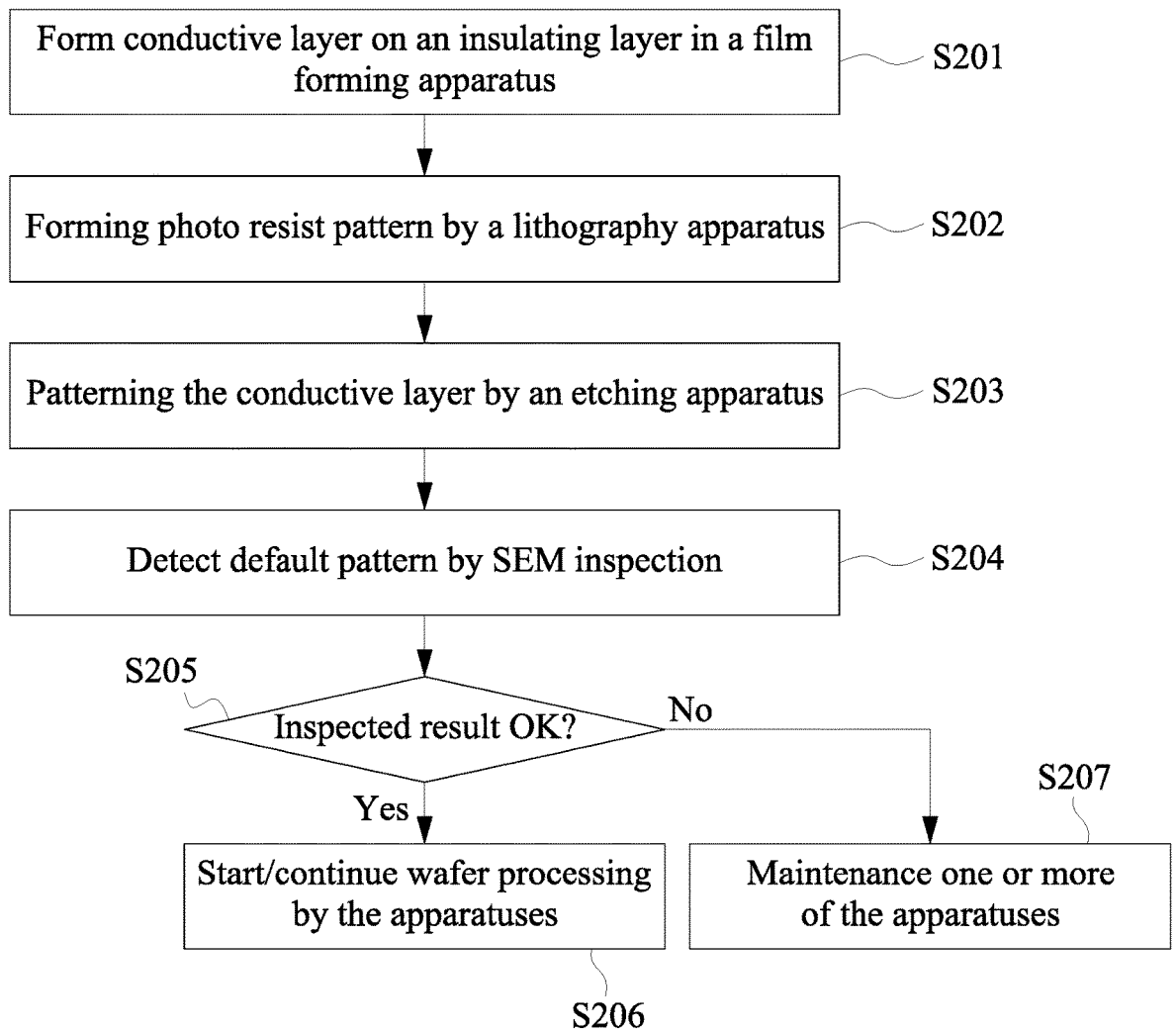
FIG. 8 is a flow chart illustrating a defect inspection operation and apparatus maintenance operation in accordance with embodiments of the present disclosure.

FIG. 8 is a flow chart illustrating a defect inspection and apparatus maintenance operation in accordance with embodiments of the present disclosure.

In some embodiments, at S201, a conductive layer is formed on an insulating layer by using a film formation apparatus. In some embodiments, the film formation apparatus is a PVD apparatus, a CVD apparatus, an ALD apparatus or a plating apparatus, or any other apparatus suitable for a conductive film formation. In some embodiments, the insulating layer is a silicon oxide layer formed over a silicon wafer by a thermal oxidation or a CVD method. In other embodiments, the insulating layer is directly formed on an insulative substrate. In some embodiments, the wafer or substrate is a test or monitor wafer not used for manufacturing an electronic device as a final product. In other embodiments, the defect inspection pattern is formed on a PCM area over a wafer or a substrate for manufacturing an electronic device as a final product.

In some embodiments, the film formation apparatus for the conductive layer and the formed conductive layer are subjected to a defect inspection and maintenance operation. In other embodiments, a film formation apparatus for the insulating layer and the insulating layer are also subjected to a defect inspection and maintenance operation. The insulating layer subjected to a defect inspection is any insulating layer used in a semiconductor manufacturing operation, including, but not limited to, silicon oxynitride, silicon nitride, silicon carbide, silicon oxy-carbide, silicon oxy-carbo-nitride, aluminum oxide, hafnium oxide, zirconium oxide, titanium oxide, a ferroelectric material or a low-k (dielectric constant) material. The insulating layer is formed by using a PVD apparatus, a CVD apparatus or an ALD apparatus in some embodiments.

At S202, a photo resist pattern is formed over the conductive material layer, by using a lithography apparatus. The lithography apparatus includes a resist coating apparatus, an exposure apparatus, and a developing apparatus. In some embodiments, the coating apparatus and the developing apparatus are integrated. In some embodiments, the exposure apparatus includes a UV lithography apparatus, a DUV lithography apparatus, an EUV lithography apparatus, or an electron beam apparatus.

By using the resist pattern as an etching mask, at S203, the conductive material layer is patterned into one or more defect inspection patterns by using an etching apparatus. In other embodiments, one or more hard mask layers are formed on the conductive material layer by using a film formation apparatus, and the hard mask layer is patterned by using the resist pattern as an etching mask in an etching apparatus, and then the conductive material layer is patterned by using the patterned hard mask layer as an etching mask in the same or another etching apparatus. In some embodiments, the hard mask pattern is removed and in other embodiments, the hard mask pattern remains over the plurality of line patterns made of the conductive material. One or more of the film formation apparatus, the lithography apparatus, and the etching apparatus are subjected to defect inspection and maintenance operation in some embodiments.

In other embodiments, the plurality of conductive line patterns 10 are embedded patterns in an insulating layer 35 as shown in FIG. 1D. In some embodiments, an insulating layer 35 is formed by using a film formation apparatus. Then, the insulating layer is patterned to have a plurality of grooves separated from each other by using an etching apparatus. Further, one or more conductive layers are formed over the wafer or substrate by using a film formation apparatus. Then, a CMP operation is performed by using a CMP apparatus to form the structure shown in FIG. 1D. In other embodiments, an etching apparatus is used for an etch-back operation. One or more of the film formation apparatus, the lithography apparatus, the etching apparatus and the CMP apparatus are subjected to defect inspection and maintenance operation.

In S204, the wafer or substrate with the one or more defect inspection patterns is loaded in an electron beam inspection tool. Then, each of the defect inspection patterns are partially or locally scanned with an electron beam as set forth above to find one or more defects. The defect inspection operation is similar to that explained with respect to FIG. 7 or any other embodiments as set forth above.

In S205, it is determined whether no defect is found in all the defect inspection patterns or the found defect(s) is within the criteria. The criteria includes the total number of defects, types of the defects (layer or material), a size of the defects and/or locations of the defects, or any other defect information that helps to determine whether any of the manufacturing apparatuses requires a maintenance operation.

If no defect is found for all defect inspection patterns or the found defect(s) is within the criteria ("Yes" at S205), a semiconductor manufacturing operation using one or more of the film formation apparatus, the lithography apparatus and the etching apparatus (and the CMP apparatus) is performed.

If the inspection result is out of the criteria ("No" at S205), a maintenance operation is performed on one or more of the film formation apparatus, the lithography apparatus and the etching apparatus (and the CMP apparatus) at S207. The target apparatus for the maintenance is determined based on the total number of defects, types of the defects (layer or material), a size of the defects and/or locations of the defects.

The foregoing inspection and/or maintenance operation can be applied to a photo mask manufacturing operation and/or a flat panel display manufacturing operation. In a case of the photo mask, the conductive layer is a Cr-based material (Cr, CrN), a Mo/Si based material (Mo/Si multilayer), a Ru based material (Ru), a Ta (TaB, TaBN) based material or any other conductive material used for a photo mask.

In some embodiments, the resist pattern of the plurality of line patterns is subjected to a defect inspection. In such a case, the resist pattern is made conductive by the addition of conductive material particles, in some embodiments.

In some embodiments, the plurality of line patterns in the defect inspection pattern are made of an insulating material different from the underlying layer. In such a case, the underlying layer may be conductive layer. In some embodiments, the conductive layer is electrically isolated or not grounded.

Figure 9A:
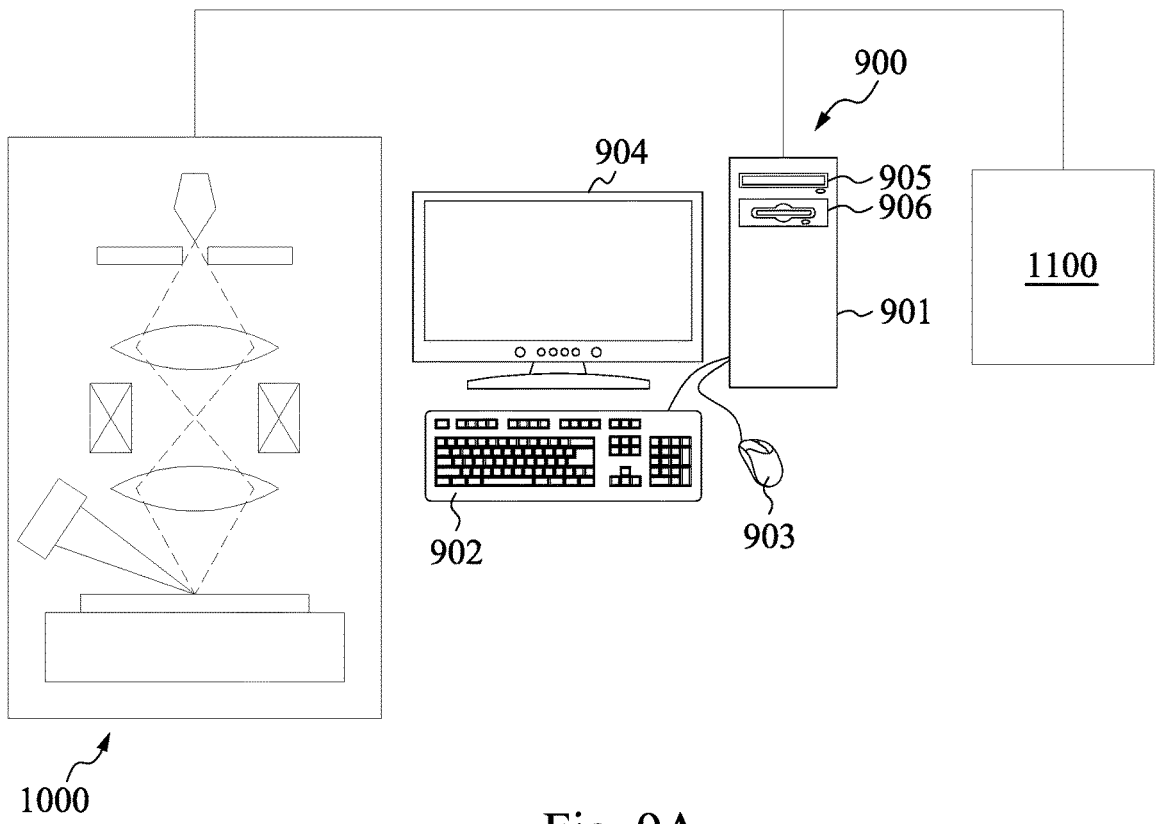
FIGS. 9A and 9B show a defect inspection system according to an embodiment of the present disclosure.
Figure 9B:
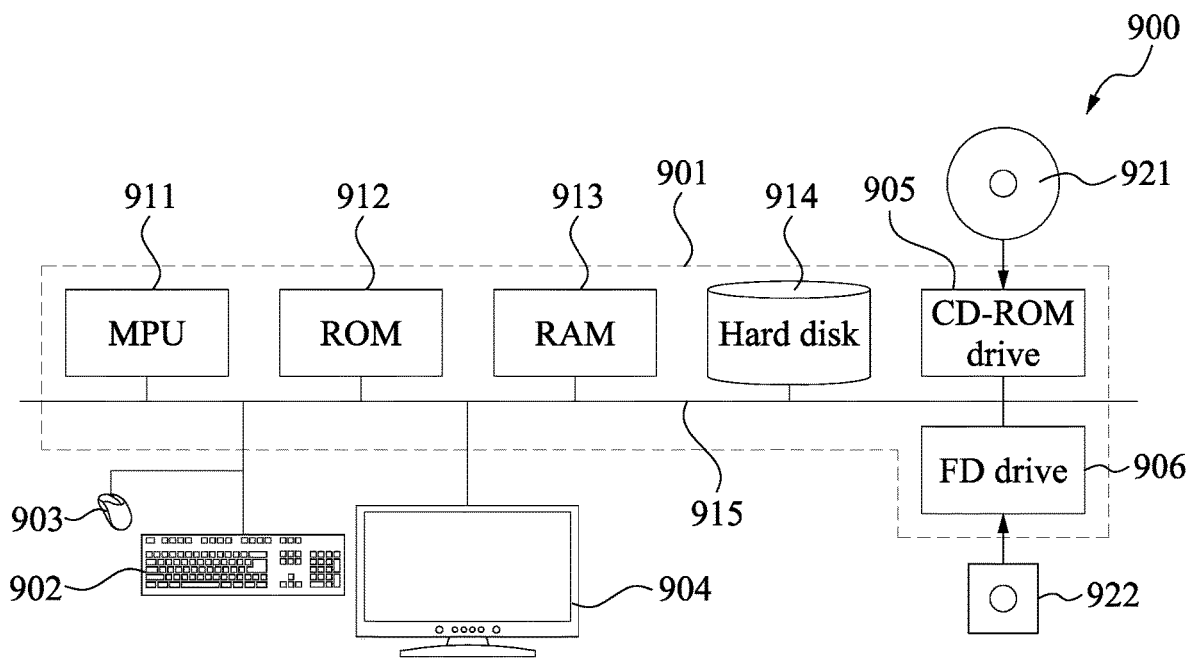

FIGS. 9A and 9B show a defect inspection system according to an embodiment of the present disclosure.

FIG. 9A is a schematic view of a computer system that executes the defect inspection and data processing according to one or more embodiments as described above. All of or a part of the process, method and/or operations of the foregoing embodiments can be realized using computer hardware and computer programs executed thereon. In FIG. 9A, a defect inspection tool 1000 using an electron beam is communicably coupled to a computer system 900. The computer system 900 is provided with a computer 901 including an optical disk read only memory (e.g., CD-ROM or DVD-ROM) drive 905 and a magnetic disk drive 906, a keyboard 902, a mouse 903, and a monitor 904. In some embodiments, the computer system 900 is a part of the defect inspection tool 1000. In some embodiments, an observation tool 1100 is separately provided from the inspection tool 1000 and communicably coupled to the computer system 900.

FIG. 9B is a diagram showing an internal configuration of the computer system 900. In FIG. 9B, the computer 901 is provided with, in addition to the optical disk drive 905 and the magnetic disk drive 906, one or more processors 911, such as a micro processing unit (MPU), a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN.

The program for causing the computer system 900 to execute the functions of the defect inspection and analysis apparatus in the foregoing embodiments may be stored in an optical disk 921 or a magnetic disk 922, which are inserted into the optical disk drive 905 or the magnetic disk drive 906, and transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network.

The program does not necessarily have to include, for example, an operating system (OS) or a third party program to cause the computer 901 to execute the functions of the defect inspection and analysis apparatus in the foregoing embodiments. The program may only include a command portion to call an appropriate function (module) in a controlled mode and obtain desired results.

In accordance with the embodiments of the present disclosure, only a part of the defect inspection pattern is scanned with the electron beam to find a defect. Accordingly, it is possible to significantly reduce an inspection time using an electron beam-based inspection tool. In some embodiments, the inspection speed is about 30 to 50 time the inspection speed when the entire area of the defect inspection pattern is scanned. Further, compared with a voltage contrast inspection (VCI), which required grounding of a conductive pattern, the structure of the test or monitor wafer is simpler in the present embodiments. In addition, methods according to embodiments of the present disclosure increased defect detection rates over optical inspection of fine pitch patterns.

It will be understood that not all advantages have been necessarily discussed herein, no particular advantage is required for all embodiments or examples, and other embodiments or examples may offer different advantages.

In accordance with one aspect of the present disclosure, in a method for inspecting pattern defects, a plurality of patterns are formed over an underlying layer. The plurality of patterns are electrically isolated from each other. A part of the plurality of patterns are scanned with an electron beam to charge the plurality of patterns. An intensity of secondary electrons emitted from the scanned part of the plurality of patterns are obtained. One or more of the plurality of patterns that show an intensity of the secondary electrons different from others of the plurality of patterns are searched. In one or more of the foregoing and following embodiments, the plurality of patterns include lines-and-spaces pattern having a plurality of line patterns disposed spaced apart from each other. In one or more of the foregoing and following embodiments, the plurality of line patterns are conductive. In one or more of the foregoing and following embodiments, the underlying layer is insulative. In one or more of the foregoing and following embodiments, the plurality of line patterns are more conductive than the underlying layer. In one or more of the foregoing and following embodiments, the plurality of patterns comprises a defect that is a broken line pattern, and during the scanning the part of the plurality of patterns, the electron beam does not scan the defect. In one or more of the foregoing and following embodiments, the plurality of patterns comprises a defect that is a bridge of adjacent line patterns, and the scanning the part of the plurality of patterns, the electron beam does not scan the defect. In one or more of the foregoing and following embodiments, when an entire length of each of the plurality of line patterns is A1, and a length A2 of the part of the plurality of patterns along a direction in which the plurality of line patterns extend, A2 is in a range from 1% to 20% of A1. In one or more of the foregoing and following embodiments, when one of the plurality of patterns showing the intensity of the secondary electrons different from others of the plurality of patterns is found, a location of the one of the plurality of patterns is obtained. In one or more of the foregoing and following embodiments, the one of the plurality of patterns of which location is obtained is observed along a direction in which the plurality of line patterns to find a defect.

In accordance with another aspect of the present disclosure in a method for inspecting pattern defects, groups of a plurality of patterns are formed over an underlying layer. The plurality of patterns are electrically isolated from each other. A part of a first group of the plurality of patterns is scanned with an electron beam to find a defect. An intensity of secondary electrons emitted from the scanned part of the first group of the plurality of patterns is obtained. One or more of the plurality of patterns in the first group that show an intensity of the secondary electrons different from others of the plurality of patterns in the first group are searched. When one of the plurality of patterns showing the intensity of the secondary electrons different from others of the plurality of patterns is found, a location of the one of the plurality of patterns is obtained. A part of a second group of the plurality of pattern is scanned with the electron beam to find a defect. In one or more of the foregoing and following embodiments, the plurality of line patterns are conductive, and the underlying layer is insulative. In one or more of the foregoing and following embodiments, the plurality of patterns in each of the groups comprise lines-and-spaces pattern having a plurality of line patterns disposed spaced apart from each other. In one or more of the foregoing and following embodiments, at least one of a pattern width, a pattern pitch or a pattern direction of the plurality of line patterns in the first group is different from that in the second group. In one or more of the foregoing and following embodiments, the electron beam scans only a part of each of the plurality of line patterns in the first group. In one or more of the foregoing and following embodiments, the underlying layer is disposed over a semiconductor wafer, and the semiconductor wafer is a test wafer on which no pattern that is or is to be a part of a transistor is formed. In one or more of the foregoing and following embodiments, when an entire length of each of the plurality of line patterns is A1, and a length A2 of the part of the plurality of patterns along a direction in which the plurality of line patterns extend, A2 is in a range from 1% to 10% of A1.

In accordance with another aspect of the present disclosure, in a method, a conductive layer is formed over an insulative layer by using a film forming apparatus. A resist pattern is formed over the conductive layer by using a lithography apparatus. The conductive layer is patterned by using an etching apparatus into a plurality of conductive patterns. The plurality of conductive patterns are electrically isolated from each other. A pattern defect is searched by the following operations. A part of the plurality of patterns is scanned with an electron beam to charge the plurality of conductive patterns. An intensity of secondary electrons emitted from the scanned part of the plurality of conductive patterns is obtained. One or more of the plurality of patterns that show an intensity of the secondary electrons different from others of the plurality of conductive patterns are searched. When a defect is found, performing a maintenance operation on at least one of the film forming apparatus, the lithography apparatus and the etching apparatus. In one or more of the foregoing and following embodiments, the defect is observed, and which one of the film forming apparatus, the lithography apparatus and the etching apparatus is subjected to the maintenance operation is determined based on the observation. In one or more of the foregoing and following embodiments, when no defect is found, a semiconductor manufacturing operation by using the film forming apparatus, the lithography apparatus and the etching apparatus is performed. In one or more of the foregoing and following embodiments, the conductive layer includes one or more layers of Ti, T, W, Co, Ni, Mo, Cu, Al, Ru, an alloy thereof and a semiconductor material.

In accordance with another aspect of the present disclosure, a test device for detecting a defect includes an underlying layer disposed over a substrate and a plurality of line patterns electrically isolated from each other disposed over the underlying layer. The plurality of line patterns are more conductive than the underlying layer, and the plurality of line patterns includes at least one of a defect that is a broken line pattern or a defect that is a bridge of adjacent line patterns. In one or more of the foregoing and following embodiments, the plurality of line patterns includes a first group of line patterns and a second group of line patterns, and at least one of a line width, a line pitch or a pattern direction is different between the first group and the second group. In one or more of the foregoing and following embodiments, the substrate and the underlying layer includes no pattern. In one or more of the foregoing and following embodiments, the plurality of line patterns includes a first group of line patterns and a second group of line patterns, the line patterns of the first group and the line patterns of the second group are alternately arrange along a first direction, and the first group and second group are shifted from each other along a second direction crossing the first direction.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for inspecting pattern defects, the method comprising:
    forming a test pattern including a plurality of patterns and a frame pattern surrounding the plurality of patterns over an underlying layer, the plurality of patterns being electrically isolated from each other and from the frame pattern;
    charging the plurality of patterns and the frame pattern by scanning only a part of the plurality of patterns with an electron beam;
    obtaining an intensity of secondary electrons emitted from the scanned part of the plurality of patterns; and
    searching one or more of the plurality of patterns only the part of which are scanned and which show an intensity of the secondary electrons different from others of the plurality of patterns only the part of which are scanned, by comparing the intensity of the secondary electrons of the plurality of patterns with each other to obtain a location of a defect,
    wherein, during the scanning the part of the plurality of patterns, the electron beam does not scan the defect, the plurality of patterns comprise line-and-space patterns having a plurality of line patterns disposed spaced apart from each other,
    when an entire length of each of the plurality of line patterns is A1, a scanned width along a direction in which the plurality of line patterns extend is A2, and A2 is in a range from 1% to 20% of A1,
    scanning only the part of the plurality of patterns with an electron beam is performed in a skipped manner, and
    the skipped manner includes performing an odd line-pattern scanning and performing an even line-pattern scanning, wherein the odd line-pattern scanning and the even line-pattern scanning are performed along a same path within the part of the plurality of patterns.

2. The method of claim 1, wherein the plurality of line patterns are conductive and the underlying layer is insulative.

3. The method of claim 1, wherein the plurality of line patterns are more conductive than the underlying layer.

4. The method of claim 1, wherein:
    the plurality of patterns comprises a defect that is a broken line pattern.

5. The method of claim 1, wherein:
    the plurality of patterns comprises a defect that is a bridge of adjacent line patterns.

6. The method of claim 1, further comprising when one of the plurality of patterns showing the intensity of the secondary electrons different from others of the plurality of patterns is found, obtaining the location of the one of the plurality of patterns.

7. The method of claim 6, further comprising observing the one of the plurality of patterns of which location is obtained along a direction in which the plurality of line patterns extend to find a defect.

8. A method for inspecting pattern defects, the method comprising:
    forming a test pattern including groups of a plurality of patterns and a frame pattern surrounding the groups of a plurality of patterns over an underlying layer, the plurality of patterns being electrically isolated from each other and from the frame pattern;
    charging the plurality of patterns by scanning only a part of a first group of the plurality of patterns with an electron beam to find a defect;
    obtaining an intensity of secondary electrons emitted from the scanned part of the first group of the plurality of patterns;
    searching one or more of the plurality of patterns in the first group only the part of which are scanned and which show an intensity of the secondary electrons different from others of the plurality of patterns only the part of which are scanned in the first group, by comparing the intensity of the secondary electrons of the first group of the plurality of patterns with each other;
    when one of the plurality of patterns showing the intensity of the secondary electrons different from others of the plurality of patterns is found, obtaining a location of the one of the plurality of patterns; and
    scanning a part of a second group of the plurality of pattern with the electron beam to find a defect,
    wherein, during the scanning the part of the first group of the plurality of patterns, the electron beam does not scan the defect, the plurality of patterns comprise line-and-space patterns having a plurality of line patterns disposed spaced apart from each other,
    when an entire length of each of the plurality of patterns is A1, a scanned width along a direction in which the plurality of patterns extend is A2, and A2 is in a range from 1% to 20% of A1,
    scanning only the part of the first group of the plurality of patterns with an electron beam is performed in a skipped manner, and
    the skipped manner includes performing an odd line-pattern scanning and performing an even line-pattern scanning, wherein the odd line-pattern scanning and the even line-pattern scanning are performed along a same path within the part of the first group of the plurality of patterns.

9. The method of claim 8, wherein the plurality of line patterns are conductive, and the underlying layer is insulative.

10. The method of claim 8, wherein the plurality of patterns in each of the groups comprise line-and-space patterns having a plurality of line patterns disposed spaced apart from each other.

11. The method of claim 10, wherein at least one of a pattern width, a pattern pitch or a pattern direction of the plurality of line patterns in the first group is different from that in the second group.

12. The method of claim 8, wherein the underlying layer is disposed over a semiconductor wafer, and the semiconductor wafer is a test wafer on which no pattern that is or is to be a part of a transistor is formed.

13. The method of claim 8, wherein A2 is in a range from 1% to 10% of A1.

14. The method of claim 1, wherein A2 is in a range from 1% to 10% of A1.

15. The method of claim 1, wherein A2 is in a range from 2% to 5% of A1.

16. The method of claim 12, wherein A2 is in a range from 2% to 5% of A1.

17. The method of claim 13, further comprising observing the one of the plurality of patterns of which location is obtained along a direction in which the plurality of line patterns extend to find a defect.

18. The method of claim 8, wherein:
  the plurality of patterns comprises a defect that is a broken line pattern.

19. The method of claim 8, wherein:
  the plurality of patterns comprises a defect that is a bridge of adjacent line patterns.

20. The method of claim 8, wherein the plurality of line patterns are more conductive than the underlying layer.

* * * * *